United States Patent [19]

Raleigh et al.

[11] Patent Number: 5,770,984

[45] Date of Patent: Jun. 23, 1998

[54] FILTER FORMED WITH A ONE PIECE U-SHAPE FERRITE CORE

[75] Inventors: Michael P. Raleigh, Buffalo Grove; Thomas McCartney, Lake Bluff, both of Ill.

[73] Assignee: Corcom, Inc., Libertyville, Ill.

[21] Appl. No.: 701,843

[22] Filed: Aug. 23, 1996

[51] Int. Cl.⁶ .................................................. H03H 7/09
[52] U.S. Cl. ............................ 333/185; 333/181; 336/73
[58] Field of Search .................................... 333/181, 182, 333/185; 336/73

[56] References Cited

U.S. PATENT DOCUMENTS

| | | | |
|---|---|---|---|
| 2,466,028 | 4/1949 | Klemperer | 336/73 X |
| 4,384,263 | 5/1983 | Neuman et al. | 333/181 |
| 4,488,201 | 12/1984 | Webb et al. | 337/8 X |
| 4,622,526 | 11/1986 | Schneider et al. | 333/181 |
| 4,761,623 | 8/1988 | Schneider | 333/167 |
| 5,321,373 | 6/1994 | Shusterman et al. | 333/185 X |
| 5,434,740 | 7/1995 | Chan | 333/118 |
| 5,446,428 | 8/1995 | Kumeji et al. | 333/185 |

FOREIGN PATENT DOCUMENTS

| | | | |
|---|---|---|---|
| 60-85616 | 5/1985 | Japan | 333/181 |
| 3272119 | 12/1991 | Japan | 333/185 |

*Primary Examiner*—Robert Pascal
*Assistant Examiner*—Justin P. Bettendorf
*Attorney, Agent, or Firm*—Hill & Simpson

[57] ABSTRACT

An EMI filter formed with a U-shaped ferrite core with parallel first and second legs and a center leg surrounded by a grounding and shorting strap and a capacitor connected between the grounding and shorting strap and a portion of a conductor which extends between the first and second legs. Two or more of the filters can be formed as a stacked array. The filter has a substantially improved frequency response over the prior art.

6 Claims, 3 Drawing Sheets

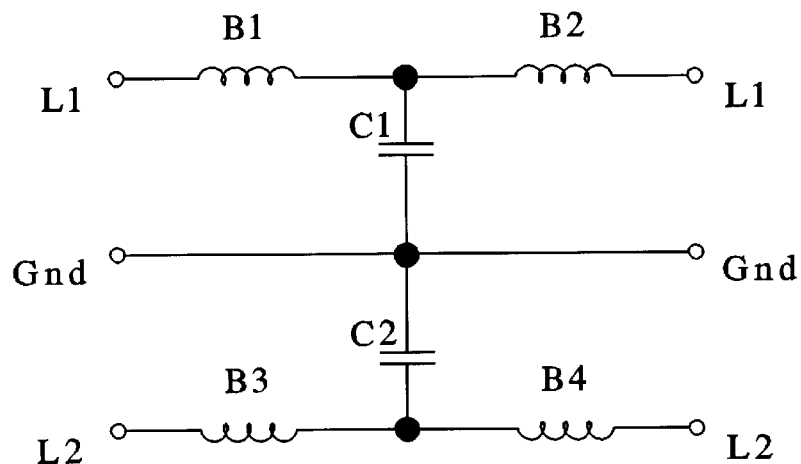
FIG. 6
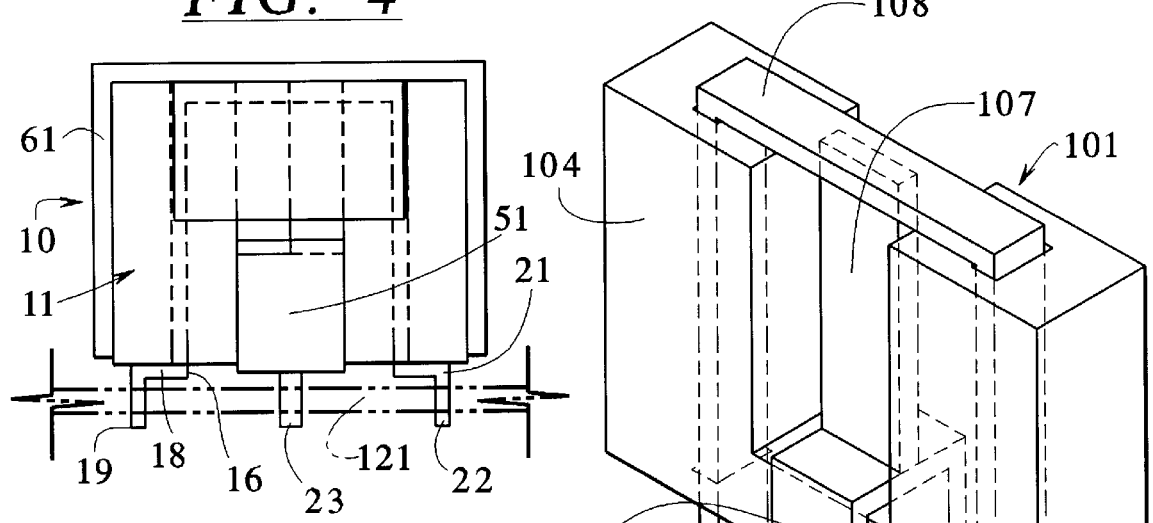
FIG. 4
FIG. 5
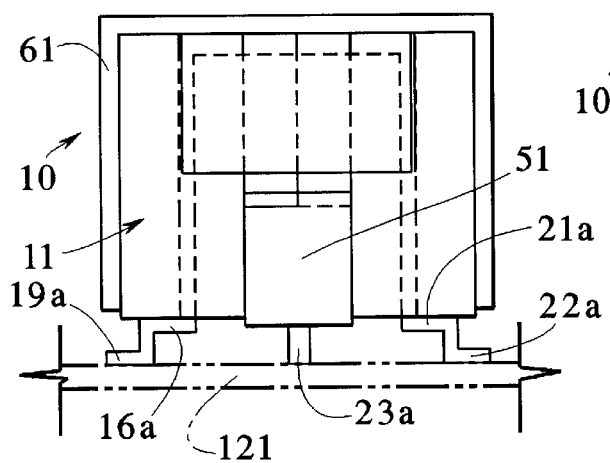
FIG. 3

FILTER FORMED WITH A ONE PIECE U-SHAPE FERRITE CORE

BACKGROUND OF THE INVENTION

1. Field of the Invention

The present invention relates to an EMI filter structure which can be board mounted and which comprises a symmetrical T arrangement with two series inductors and a shunt capacitor and wherein the two series conductors are formed with a single U-shaped ferrite core so as to provide the mechanical structure for the filter.

2. Description of the Related Art

Prior art EMF filters have used a pair of inductors which are separate from each other and which are joined by an inert base leg.

See also U.S. Pat. Nos. 4,384,263, 4,622,526, 4,488,201, 4,761,623 and 5,434,740.

SUMMARY OF THE INVENTION

The present invention relates to an improved EMI filter which comprises a U-shaped block ferrite core which replaces two linear ferrite cores with a third inert base. The filter is formed with the U-shaped ferrite core with leads passing through the two legs of the core and with a grounded shorting strap around the middle leg and one or more capacitors extending from the center part of one of the leads to the grounding strap around the center leg of the ferrite core. The filter of the invention can be made in a number of stack segments by making the U-shaped core of variable thickness so that one or more leads can be formed through the U-shaped core so as to form multiple filter elements. The filter of the invention can be made with a range of capacitor values, allowing for varying range of performance.

The one piece ferrite core provides both the mechanical structure and the two inductor elements in a single low cost part. The present invention can be used as a filter in signal lines, phone lines or any network. A shorting strip around the center leg of the ferrite eliminates coupling between the two ferrite ends thus allowing the frequency response of the filter to center at a higher frequency. The shorting strap is also used as the ground connection of the filter.

The filter of the invention can be surface mounted on a printed circuit board or it can have leads which extend through the printed circuit board.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 3 is a side plan view of a filter which is surface mounted on a printed circuit board;

FIG. 4 is a side view of a filter which has leads which extend through a printed circuit board;

FIG. 5 is a perspective view of a single element filter;

FIG. 6 is a schematic diagram of a filter according to the invention; and

DESCRIPTION OF THE PREFERRED EMBODIMENTS

Figure 1:
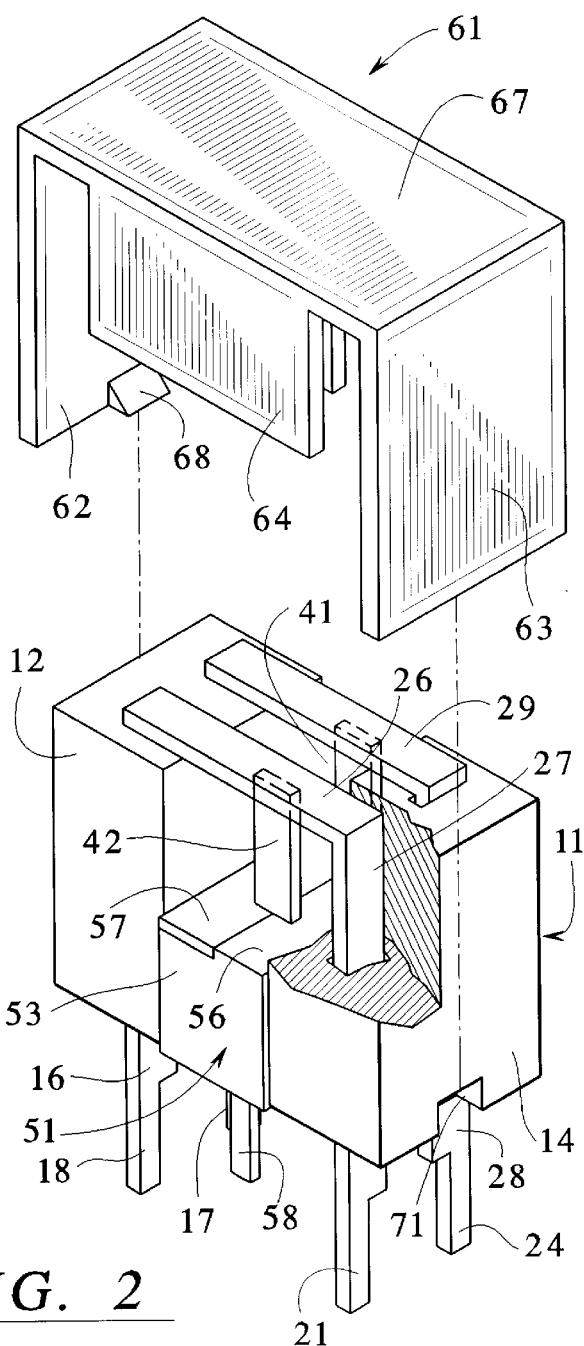
FIG. 1 is an exploded view of the filter of the invention.

FIG. 5 illustrates a U-shaped filter 101 according to the invention which has a U-shaped core formed of a linear leg 102 which is joined to a cross leg 103 to which a second linear leg 104 is attached at the other end. A grounding strap 106 fits around the center leg 103 and has a grounding conductor 111 attached thereto. A lead 108 extends through an opening in the leg 104 and extends across the open end from leg 104 to an opening formed in leg 102 and through leg 102 and extends as a lead 109. A capacitor 107 is electrically connected between the grounding strap 106 and the center portion of lead 108 between the legs 102 and 104 as shown in FIG. 5.

Figure 2:
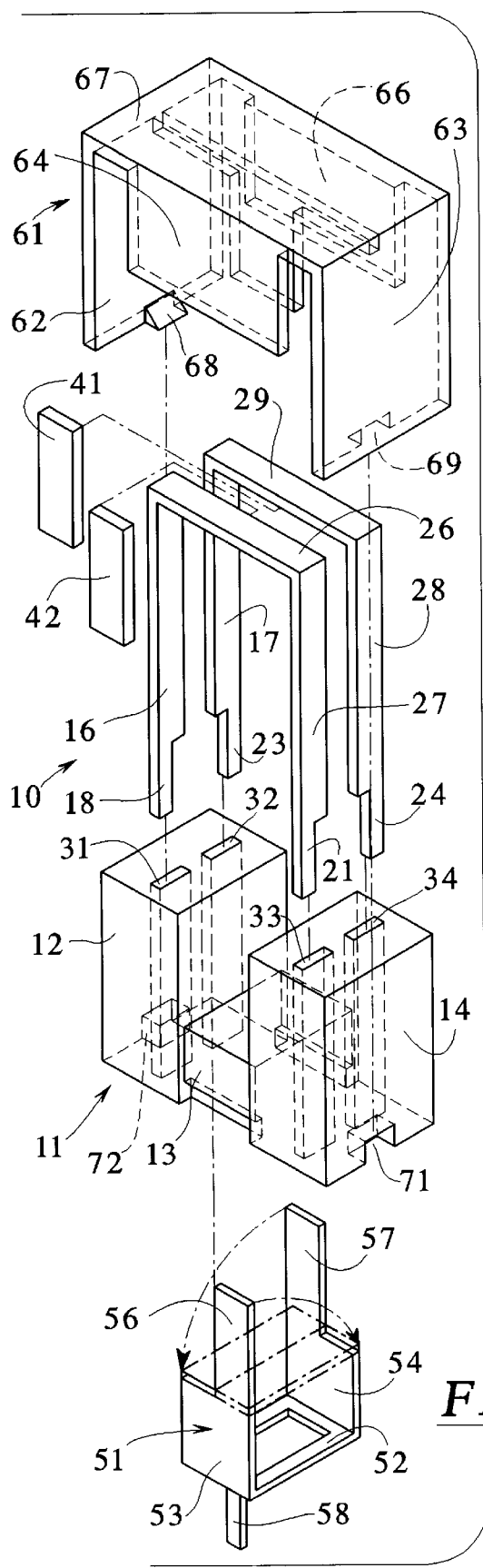
FIG. 2 is an exploded view of the invention.

FIGS. 1 and 2 illustrate filters according to the invention of a stack structure wherein, for example, two or more of the filters shown in FIG. 5 are formed as stacked units. For example, in FIGS. 1 and 2, a filter 10 is formed of a U-shaped core member 11 which is formed with a vertical leg 12 which is joined by a center portion 13 to a second leg 14. A grounding strap 51 fits about the center leg 13 and has a bottom portion 52 which fits against the bottom of the leg 13 and has side walls 53 and 54 which contact the side walls of the leg 13 and a pair of top members 56 and 57 which are bent down to enclose the top surface of the center leg 13 and perform as a shorting strap as illustrated in FIG. 1.

Openings 31 and 32 are formed through the leg 12, and openings 33 and 34 are formed through the legs 14 as shown in FIG. 2. Lead 16 has a first end 18 which extends outwardly from the bottom of leg 12, and the lead 16 extends up through the opening 31 and has a cross portion 26 which extends from the open end of the leg 12 to the opening 33 in leg 14. The portion 27 of lead 16 passes down through the leg 14 and extends therefrom as a lead 21. A second lead 17 passes through the opening 32 and has a lower end 23 which extends from the bottom of leg 12 and a center portion 29 which extends from the opening 32 in leg 12 to the opening 34 in leg 14. The lead 17 has a portion 28 which extends downwardly through the leg 14 in opening 34 and extends outwardly to form a lead 24. A first capacitor 41 is electrically connected to the grounding strap portions 57 and 56 of the strap 51 and has its upper end electrically connected to the portion 29 of the lead 17. A second capacitor 42 extends from the grounding strap portions 56 and 57 of grounding strap 51 to the portion 26 of lead 17 as shown. A grounding lead 58 extends as illustrated from the grounding strap 51.

A cover member 61 which may be of plastic has end portions 62 and 63 and a top cover portion 67 and side portions 64 and 66. Locking tabs 68 and 69 are formed on the lower portions of legs 62 and 63 and are received in notches 72 and 71 formed in the legs 12 and 14.

FIG. 3 illustrates the filter 10 of the invention mounted on a circuit board 121 with leads 16a, and 21a. One end 19a of the lead 16a has a horizontally bent portion which is connected, as by soldering, to the printed circuit board 121. The grounding lead 23a is connected as by soldering to the printed circuit board 121 to ground the grounding strap 51. The end 22a of lead portion 21a is bent horizontally as shown in FIG. 3 and is connected as by soldering to the printed circuit board 121. It is noted that the filter 10 illustrated in FIG. 3 is offset from the printed circuit board to allow cooling.

FIG. 4 illustrates a modification of the invention wherein the leads 16 and 21 are connected to portions 19 and 22 which extend through the circuit board 121 and are electrically connected thereto. The grounding strap lead 23 also extends through the circuit board 121 and is connected thereto.

FIG. 6 is an electrical schematic of a filter such as shown in FIGS. 1 and 2 wherein the first filter has an electrical lead L1 which extends through the first leg 12 which is shown as inductor B1 and then through a second leg 14 which is illustrated as inductor B2. From the center portion 26 of the leg L1, a capacitor C1 which corresponds to the capacitor 42 shown in FIGS. 1 and 2 extends to the grounding strap 51. A second capacitor C2 comprises the capacitor 41 which extends from the grounding strap 51 to the center portion 29 of lead 17. The leg 12 through which the lead 17 extends is indicated by an inductor B3. The leg 14 through which the lead 28 extends is illustrated by the inductor B4.

Figure 7:
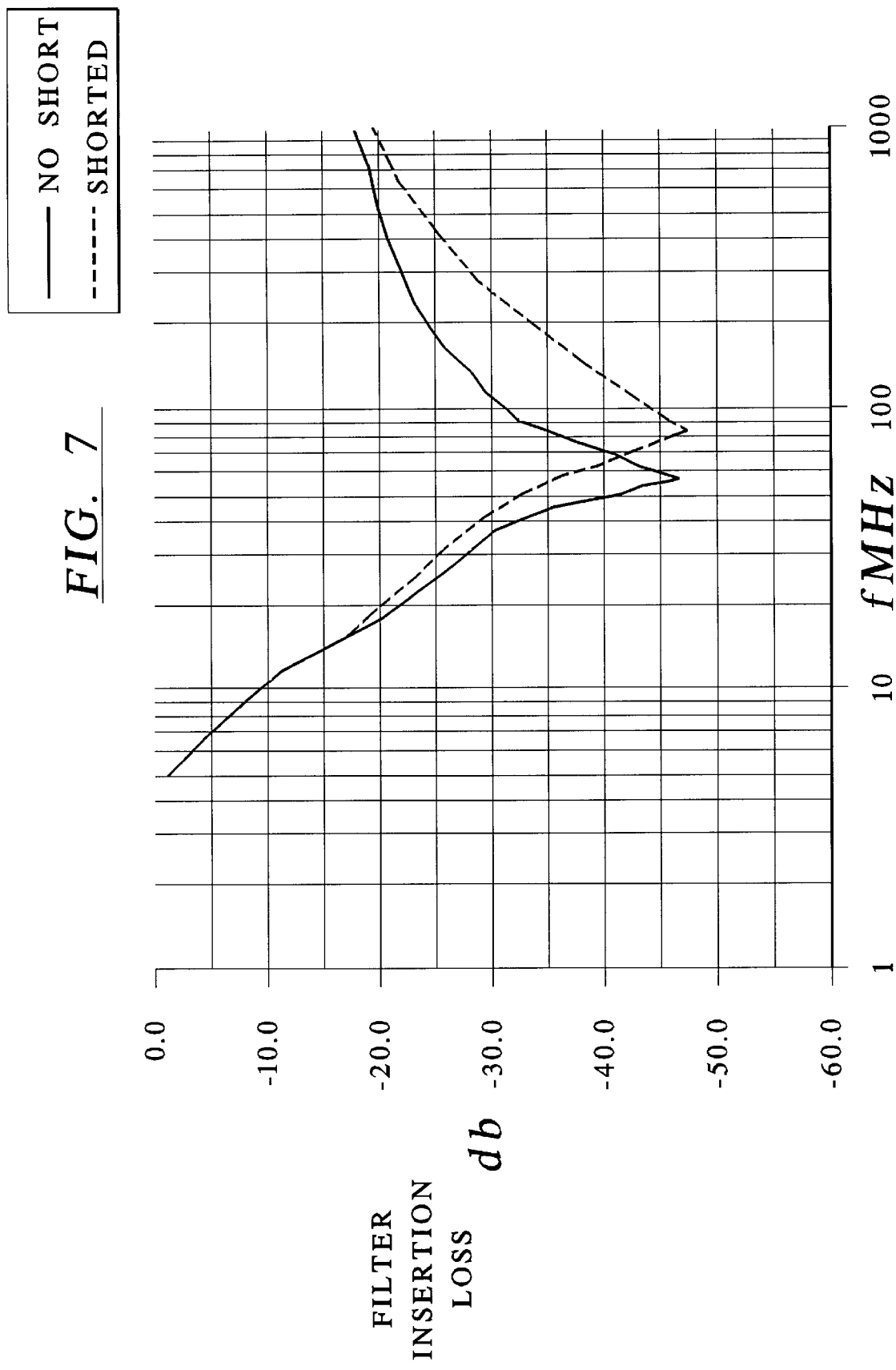
FIG. 7 is a plot of the frequency response of a filter according to the invention.

FIG. 7 illustrates the frequency response of a filter, using capacitors with values of 820 pf, according to the present invention wherein the solid line curve illustrates the filter response without the center leg shorted. The dashed line represents the filter response of a filter according to the invention which has a U-shaped ferrite core with a shorting strip about the center leg. It is to be particularly noted that the shorting strip structure according to the present invention has a higher frequency response and thus, provides more attenuation at higher frequencies and results in an improved filter. The shorting strip results in less coupling between the two ferrite legs, and thus, improves the frequency response of the device and, as shown by FIG. 7, has maximum insertion loss at about 85 MHZ whereas the non-shorted filter has maximum insertion loss at about 50 MHZ. Such a change in frequency response results in a filter which is superior in performance.

It is seen that this invention provides an improved EMI filter formed with U-shaped ferrite legs, and it has been described with respect to preferred embodiments. It is not to be so limited as changes and modifications can be made therein which are within the full intended scope of the invention as defined by the appended claims.

We claim as our invention:

1. An EMI filter comprising:

a U-shaped core formed of magnetic material having high permeability, said U-shaped core formed with first and second legs which are parallel and are joined at only one end by a third leg;

a grounding and shorting means formed about said third leg between said first and second legs;

an electrical conductor with a first portion which extends through said first leg and has a second portion which extends between the second ends of said first and second legs and has a third portion which extends through said second leg; and a capacitor connected between said grounding and shorting means and said second portion of said electrical conductor.

2. The EMI filter according to claim 1 wherein said U-shaped core is formed of ferrite material.

3. The EMI filter according to claim 1 further comprising:

a cover on said U-shaped core.

4. An EMI filter comprising:

a U-shaped core formed of high permeability magnetic material, said U-shaped core formed with first and second parallel legs which are joined at only one end by a transverse third leg;

a grounding and shorting means formed about said third leg;

a plurality of electrical conductors each with first portions which extend through said first leg and each electrical conductor having second portions which extend between the second ends of said first and second legs, and each electrical conductor having third portions which extend through said second leg; and a plurality of capacitors each of which is connected between said grounding and shorting means and a second portion of one of said plurality of electrical conductors.

5. The EMI filter according to claim 4 wherein said U-shaped core is formed of ferrite material.

6. The EMI filter according to claim 4 further comprising:

a cover on said U-shaped core.

* * * * *